Feb. 16, 1971 S. L. KNANISHU 3,564,436
HIGH INPUT IMPEDANCE AMPLIFIER
Filed Feb. 28, 1968
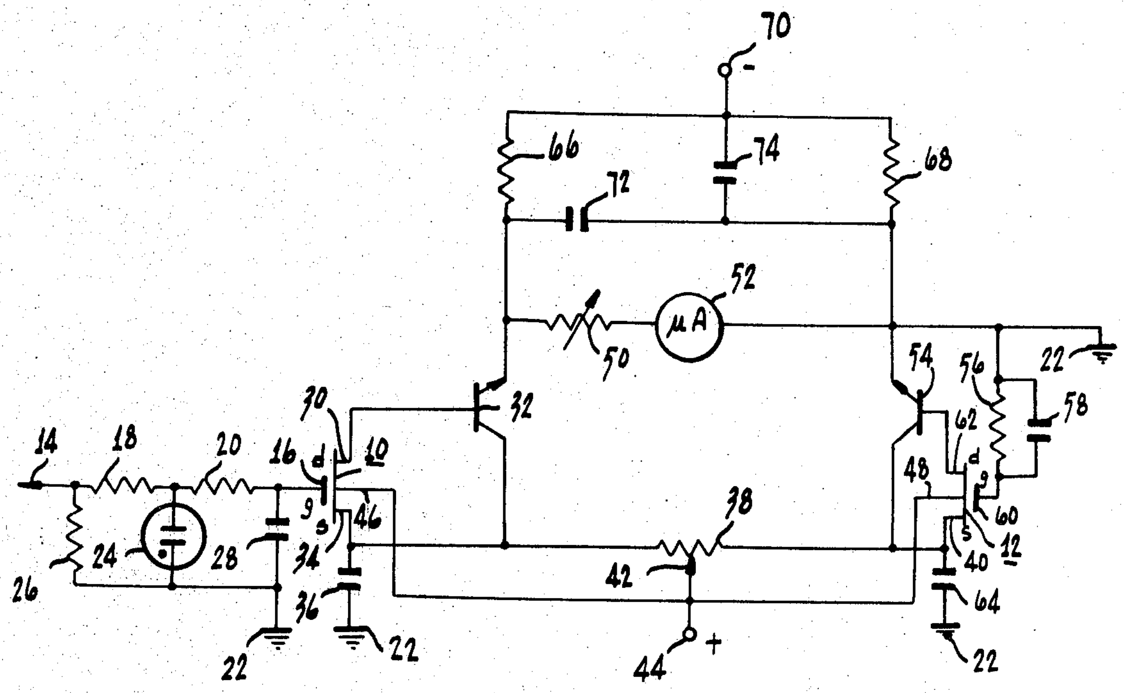
INVENTOR
SANDER L. KNANISHU
BY [signature]
ATTORNEY

United States Patent Office 3,564,436
Patented Feb. 16, 1971

3,564,436

HIGH INPUT IMPEDANCE AMPLIFIER

Sander L. Knanishu, Tappan, N.Y., assignor to RCA Corporation

Filed Feb. 28, 1968, Ser. No. 708,867
Int. Cl. H03f 3/26, 3/04
U.S. Cl. 330—3 4 Claims

ABSTRACT OF THE DISCLOSURE

A high input impedance amplifier suitable for coupling very low current or voltage to be measured to a meter includes at least one insulated gate field effect transistor to which the current or voltage to be measured is applied and at least one bipolar current controlled transistor whose input is coupled to the field effect transistor and whose output is coupled to the meter.

BACKGROUND

In making current and voltage measurements, the meter loads the circuit where the current or voltage to be measured appears, whereby the presence of the meter itself, if it is a low input impedance meter, so changes the voltage and current to be measured that the readings given by the meter are inaccurate. In measuring small currents and voltages, it is known to apply the small voltage, or a voltage produced by flow of a small current through a known resistor, to the input of a tube type amplifier whose output is applied to the meter. Since the tubes are potential operated devices they do not load the circuit where the voltages or currents to be measured appear when direct current or voltage measurements are being made. However, tube type amplifiers are bulky, they require high operating voltages and currents and they are fragile.

It is an object of this invention to provide an improved amplifier suitable for coupling a very small current or voltage to a meter.

It is a further object of this invention to provide an improved amplifier, which does not require tubes, and which has a very high input impedance.

SUMMARY

In accordance with the invention, an amplifier including an insulated gate field effect transistor input stage and a bipolar transistor output stage is provided. The current or voltage to be measured is coupled to the insulated gate of the field effect transistor, and the emitter of the bipolar transistor is coupled to a meter. To increase the linearity of amplification of the amplifier and also the sensitivity thereof, means are provided for producing both negative and positive feedback in the amplifier circuit.

SHORT DESCRIPTION

The invention will be better understood upon reading the following description in connection with the accompanying drawing, the single figure of which illustrates a circuit diagram of an amplifier according to this invention.

A pair of P-channel MOS, insulated gate field effect silicon transistors 10 and 12, which operate in the enhancement mode, are provided. A probe 14 is connected to the insulated gate 16 of the transistor 10 through two resistors 18 and 20 in series. The junction of the resistors 18 and 20 is connected to system ground 22 by way of a voltage break down device such as a gas filled tube 24. The other terminal of the resistor 18 is connected to ground 22 by way of a large resistor 26. A capacitor 28 is connected between the other terminal of the resistor

20 and ground 22. As will be explained, the elements 18, 20, 24 and 28 comprise a protective circuit for the transistor 10. The resistor 26 is connected to be the input resistor for the transistor 10 and its impedance may be very high such as one hundred million ohms or higher.

The drain 30 of the transistor 10 is connected to the base of a NPN bipolar transistor 32, whose collector is connected directly to the source 34 of the transistor 10. The source 34 of the transistor 10 is connected to ground 22 through a filter or by-pass capacitor 36. The source 34 is also connected through a potentiometer 38 to the source 40 of the transistor 12. The slider 42 of the potentiometer 38 is connected to the positive terminal 44 of a source of operating potential, not shown. The terminal 44 is connected to the substrate 46 of the transistor 10 and to the substrate 48 of the transistor 12. The emitter of the transistor 32 is connected by way of a variable calibrating resistor 50 to one terminal of a microammeter 52. The other terminal of the microammeter 52 is connected directly to the emitter of a second NPN bipolar transistor 54 and also directly to ground 22. A resistor 56, shunted by a filtering capacitor 58, is connected between ground 22 and the insulated gate 60 of the transistor 12.

The drain 62 of the transistor 12 is connected directly to the base of the transistor 54. The source 40 of the transistor 12 is connected to ground 22 by way of a bypass capacitor 64.

The emitters of the transistors 32 and 54 are connected by way of respective load resistors 66 and 68 to the negative terminal 70 of the source of operating potential. A filter capacitor 72 is connected between the emitters of the transistors 32 and 54 and a filter capacitor 74 is connected across the resistor 68.

In the operation of the circuit of the figure, a direct voltage or current to be measured appears between the probe 14 and ground 22. The voltage applied to the gate 16 is poled to be positive on the gate 16 of the transistor 10 with respect to its source 34 and it is positive on the source 40 of the transistor 12 with respect to its gate 60 due to the circuit which is traced from ground 22 to the gate 16 of the transistor 10, to the source 34 of the transistor 10, through the resistance of the potentiometer 38 to the source 40 of the transistor 12, to the gate 60 of the transistor 12, through the resistor 56 and back to ground 22. That is, the input voltage is applied between the gates 16 and 60 of the transistors 10 and 12 in a push-pull manner.

As the gate 16 of the transistor 10 goes positive its drain 30 goes in the negative direction. The negative going potential on the drain 30 is applied to the base of the transistor 32, causing the collector of the transistor 32 to become more positive. This positive going potential is fed back to the source 34 by direct coupling of the collector of the transistor 32 and source 34 of the transistor 10, introducing a negative feedback at the input of transistor 10. The relatively negative voltage with respect to source 40 applied to the gate 60 of the transistor 12 causes the drain 62 of transistor 12 to go more positive, driving the base of transistor 54 more positive and causing the collector of the transistor 54 to become more negative. Since the collector of the transistor 54 is directly coupled to the source 40 of transistor 12, it introduces a negative feedback at the input of the transistor 12. This negative feedback to the transistors 10 and 12 improves the linearity of the amplification provided by the described amplifier.

Another feedback connection is also provided by the described circuit in that the voltage appearing at the emitter of the transistor 54 with respect to terminals 44 and 70 is fed back in a negative going direction to the gate 60 of the transistor 12 by way of the resistor 56 and therefore also, in a positive going direction, to the gate 16 of the transistor 10 due to the emitter coupling between transistors 32 and 54 which results in the push-pull operation of the two transistors 10 and 12. This connection increases the sensitivity of the circuit.

The meter 52 is brought to zero by moving the slider 42 along the potentiometer 38 when no input is applied to the probe 14. In this manner, the Wheatstone bridge, two of whose arms are the two load resistors 66 and 68 and the other two of whose arms are the collector-to-emitter paths of the two transistors 32 and 54, is balanced. The meter 52 is calibrated by applying a known voltage between probe 14 and ground 22 and varying the resistor 50 until the needle of the meter 52 indicates the value of the known applied voltage.

If a voltage that is so high as to damage the transistors 10 and 12 is applied between probe 14 and ground 22, the gas filled tube 24 will break down and will glow to indicate that the applied voltage is too high. Since the breakdown voltage of the tube 24 is less than the voltage that would damage the transistors 10 and 12, that is, it is less than the break down voltage between the gates 16 and 60 of the transistors 10 and 12, connected in series, break down of the tube 24 prevents damage to the transistors 10 or 12. Resistors 18 and 20 and the capacitor 28 provide a delay circuit that will prevent the application of the damaging voltage to the gates of the transistors 10 and 12 before the tube 24 breaks down.

The sensitivity of the current or voltmeter using the described amplifier circuit is very high. An instrument has been built using a meter 52 which requires 50 microamperes of flow therethrough for full scale swing of its indicating needle. When used in connection with the described amplifier and with a 100 megohm input resistor 26, application of one nanoampere ($10^{-9}$ amperes) between the probe 14 and ground 22 resulted in the full scale swing of the indicating needle of the microammeter 52.

Since variations in the described circuit will occur to a person skilled in the art, the above description is to be taken as illustrative and not in a limiting sense.

What is claimed is:

1. A high input impedance amplifier comprising:
   - a first and a second insulated gate field effect transistor each having two main electrodes and a control electrode,
   - a first and a second bipolar transistor each having base emitter, and collector electrodes,
   - means for coupling one of said main electrodes of each of said field effect transistors to the base of a corresponding one of said bipolar transistors,
   - a DC meter coupled between the emitter electrodes of said bipolar transistors,
   - first and second terminals coupled to the gate electrodes of respective ones of said field effect transistors,

- means for applying an input signal across said first and second terminals,
   - third and fourth terminals for connection to a DC bias voltage source,
   - means for coupling the other main electrodes of said field effect transistors to each other,
   - means for coupling said collector electrodes and said other main electrodes to one of said third and fourth terminals,
   - means for coupling the emitter electrodes to the other terminal of said third and fourth terminals, and
   - means for coupling the gate electrode of one of said field effect transistors to the emitter electrode of the corresponding bipolar transistor for providing negative feedback to said one field effect transistor, whereby said DC meter provides DC signal coupling between said emitters of said bipolar transistors, so that said amplifier operates to drive said DC meter in a push-pull manner.

2. The invention as expressed in claim 1 wherein said one main electrode of each of said field effect transistors is a drain electrode and said other electrode is a source electrode.

3. The invention as expressed in claim 2, further including load resistors for said bipolar transistors, said emitter electrodes each being connected through a respective load resistor to said other terminal of said third and fourth terminals.

4. The invention as expressed in claim 1 wherein said means for coupling said other main electrodes of said field effect transistors includes a potentiometer resistor having a slider, said slider being connected to said one of said third and fourth terminals.

References Cited

UNITED STATES PATENTS 3,400,335 9/1968 Orchard et al. ........ 330—24

OTHER REFERENCES

Audio, March 1966, p. 92, "High Input Resistance With Stability," Smithey, L. D., Fig. 14.

Electronics, July 11, 1966, p. 79, "High MOS Impedance Benefits pH Measurement," by Soltz.

HEP Technical Manager, Motorola Semiconductor Products, October 1967, pp. 44, 45, Fig. 1, "Build 22 Megohm FET DC Voltmeter," by Jaques.

Electronic Design, Nov. 22, 1963, pp. 71, 72, "Low-Noise Preamplifier Gives High Input Impedance," by M. E. Lyles, Senior Research Asst., Backman Instruments, Inc., Fullerton, Calif.

NATHAN KAUFMAN, Primary Examiner

U.S. Cl. X.R.

330—24, 38, 15